(12) United States Patent  (10) Patent No.: US 9,101,057 B2
Chuang et al.  (45) Date of Patent: Aug. 4, 2015

(54) MICRO SECURE DIGITAL ADAPTER

(71) Applicant: Skymedi Corporation, Hsinchu (TW)

(72) Inventors: Chun-Lung Chuang, Hsinchu (TW);
Chien-Cheng Chen, Hsinchu (TW);
Cheng-Hung Wang, Hsinchu (TW);
Yun-Ting Wang, Hsinchu (TW);
Ming-Chung Chen, Hsinchu (TW);
Yen-Chi Peng, Hsinchu (TW);
Tsai-Jung Hung, Hsinchu (TW);
Yu-Fen Chang, Hsinchu (TW)

(73) Assignee: Skymedi Corporation, Hsinchu Science Park, Hsinchu (TW)

( * ) Notice: Subject to any disclaimer, the term of this patent is extended or adjusted under 35 U.S.C. 154(b) by 287 days.

(21) Appl. No.: 13/743,341

(22) Filed: Jan. 17, 2013

(65) Prior Publication Data

US 2014/0198460 A1  Jul. 17, 2014

(51) Int. Cl.
*H05K 1/14* (2006.01)
*H05K 5/02* (2006.01)

(52) U.S. Cl.
CPC .................................. *H05K 5/0282* (2013.01)

(58) Field of Classification Search
USPC ......... 361/737, 760, 767, 679.31; 439/55, 65, 439/625–627
See application file for complete search history.

(56) References Cited

U.S. PATENT DOCUMENTS

| | | | |
|---|---|---|---|
| 7,189,118 B2 * | 3/2007 | Lee | 439/630 |
| 7,357,677 B2 * | 4/2008 | Liu | 439/630 |
| 7,412,553 B2 * | 8/2008 | Morrow | 710/305 |
| 7,416,451 B2 * | 8/2008 | Tanaka et al. | 439/630 |
| 7,881,063 B2 * | 2/2011 | Adachi | 361/737 |
| 2007/0032135 A1 | 2/2007 | Tanaka et al. | |
| 2007/0190836 A1 | 8/2007 | Tanaka et al. | |

FOREIGN PATENT DOCUMENTS

| | | |
|---|---|---|
| TW | I253591 | 4/2006 |
| TW | M296438 | 8/2006 |
| TW | M434356 | 7/2012 |
| TW | M465726 | 11/2013 |

* cited by examiner

*Primary Examiner* — Hung S Bui
(74) *Attorney, Agent, or Firm* — Winston Hsu; Scott Margo

(57) ABSTRACT

A micro secure digital (SD) adapter, for adapting a micro SD card to an SD interface, the micro SD adapter comprising a micro SD slot, for disposing the micro SD card; a pin module, comprising a plurality of signal pins, a first ground pin, and a second ground pin; a plurality of connectors, for conducting the plurality of signal pins and the first ground pin to the micro SD card according to a pin configuration of the micro SD card when the micro SD card is disposed in the micro SD slot; and a conducting module, electrically connected between a terminal of a first connector corresponding to the first ground pin and the second ground pin.

11 Claims, 13 Drawing Sheets

MICRO SECURE DIGITAL ADAPTER

BACKGROUND OF THE INVENTION

1. Field of the Invention

The present invention relates to a micro secure digital adapter, and more particularly, to a micro secure digital adapter for transmitting high speed signals with low crosstalk.

2. Description of the Prior Art

Micro secure digital (SD) is a non-volatile memory card format derived from secure digital with a smaller size and less pins. Thus, micro SD cards are widely used in electronic devices, such as mobile phones, digital cameras, GPS navigation devices, tablet computers, etc. However, some electronic devices only support SD interface, but does not support micro SD interface, such that a micro SD adapter is necessary to transform signals between a micro SD card and the electronic device.

Except the size, the main difference between interfaces of SD and micro SD is the pin counts. SD has nine pins including two ground pins, while micro SD has eight pins including only one ground pin. Therefore, the conventional micro SD adapter usually connects the two ground pins of the SD side (near the host side) via a strip or bridge. In other words, one of the two ground pins of the SD side connects to a ground pin of the micro SD card via another ground pin first, which causes unbalance between routes from the two ground pins to the ground pin of the micro SD card. In such a situation, the return loss for signals in the data pins near the ground pin with longer route to the micro SD card is increased and the signal quality thereof is further degraded.

In detail, please refer to FIG. 11, which is a schematic diagram of a micro SD adapter 70 according to the prior art. The micro SD adapter 70 has connectors CN1-CN8, data pins PIN_D0-PIN_D3, ground pins PIN_GND1-PIN_GND2, a clock pin PIN_CLK, a voltage pin PIN_VDD and a command pin PIN_CMD. The data pins PIN_D0-PIN_D3, the ground pins PIN_GND1-PIN_GND2, the clock pin PIN_CLK, the voltage pin PIN_VDD and the command pin PIN_CMD conform to SD specification for connecting to an SD interface of a host device and transmitting signals between the micro SD card and the host device via the connectors CN1-CN8. Moreover, the ground pin PIN_GND1 connects to the ground pins PIN_GND2 via a conducting strip S, so that a route R2 from the ground pin PIN_GND2 through the conducting strip S and the ground pin PIN_GND1 to a terminal T1 of the connector CN3 is longer than a route R1 from the ground pin PIN_GND1 to the terminal T1 of the connector CN3, i.e. R2≅R1+S. Therefore, the return loss for signals in the data pins PIN_D2 and PIN_D3 near the ground pin PIN_GND2 is increased and the signal quality thereof is further degraded.

Besides, the conventional micro SD adapter conforming to version 2.0 of the SD specification faces some problems, such as worse performance of the high-frequency characteristics or severe crosstalk of signal transmissions when transforming signals between a micro SD card conforming to version 3.0 of the SD specification and the electronic device.

Therefore, providing a stable micro secure digital adapter to solve the abovementioned issues is necessary.

SUMMARY OF THE INVENTION

The present invention therefore provides a micro secure digital adapter for reducing the return loss and the crosstalk, to improve the signal quality.

A micro secure digital (SD) adapter, for adapting a micro SD card to an SD interface is disclosed. The micro SD adapter comprises a micro SD slot, for disposing the micro SD card; a pin module, comprising a plurality of signal pins, a first ground pin, and a second ground pin; a plurality of connectors, for conducting the plurality of signal pins and the first ground pin to the micro SD card according to a pin configuration of the micro SD card when the micro SD card is disposed in the micro SD slot; and a conducting module, electrically connected between a terminal of a first connector corresponding to the first ground pin and the second ground pin; wherein a route from the second ground pin through the conducting module to the terminal of the first connector substantially equals a route from the first ground pin through a part of the first connector to the terminal of the first connector.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
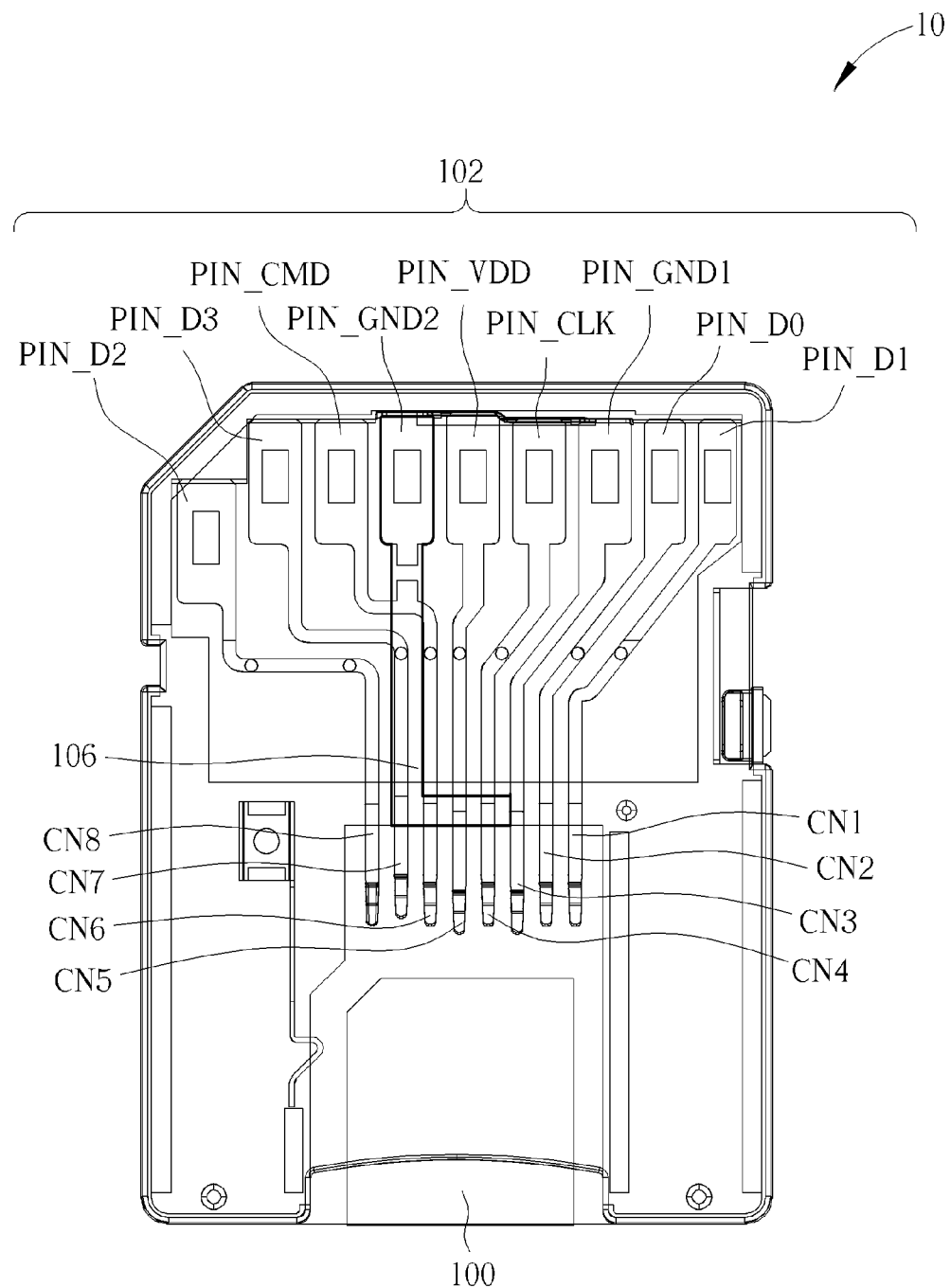
FIGS. 1A-1C are schematic diagrams of a micro secure digital adapter according to the present invention.
Figure 1B:
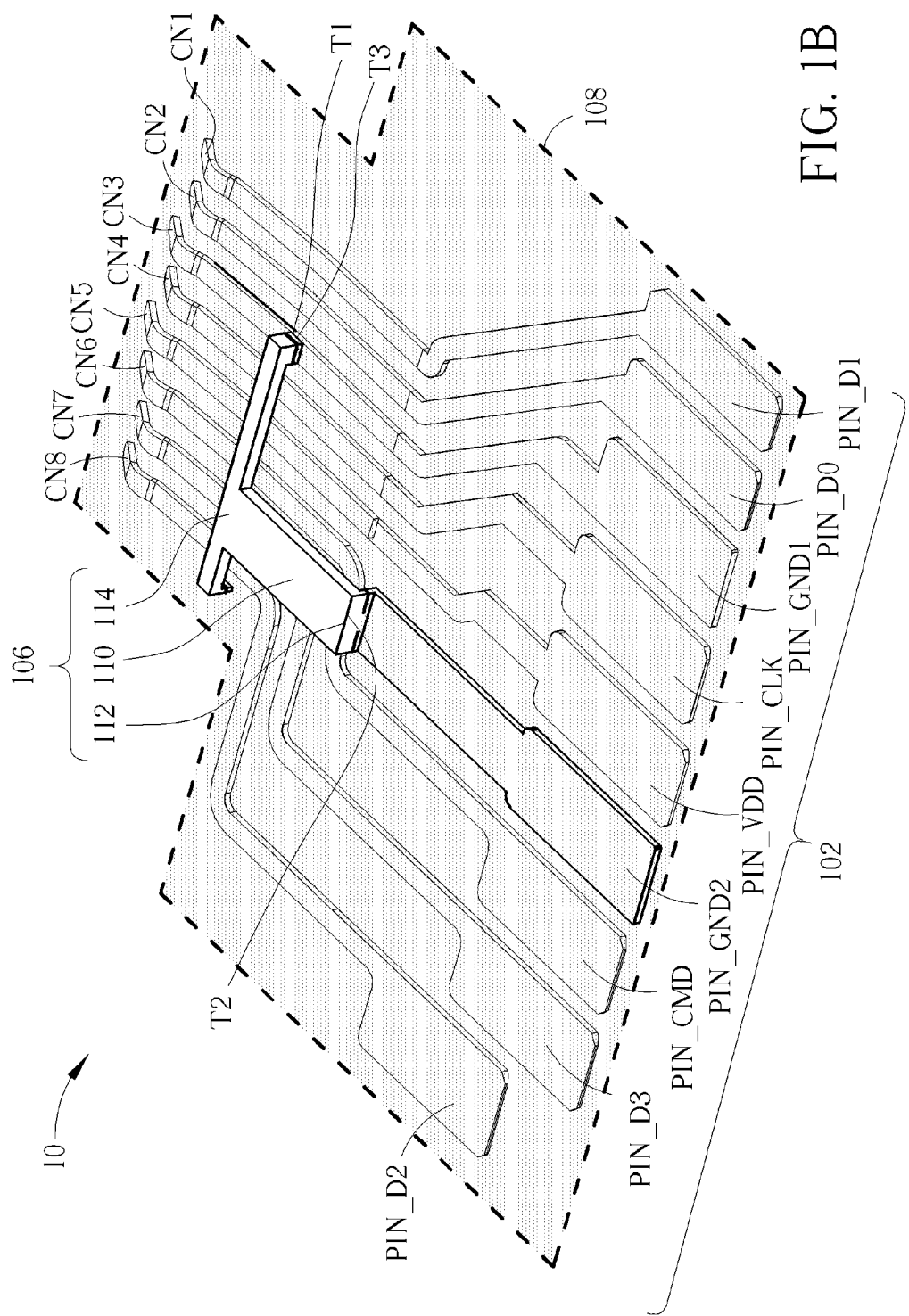
Figure 1C:
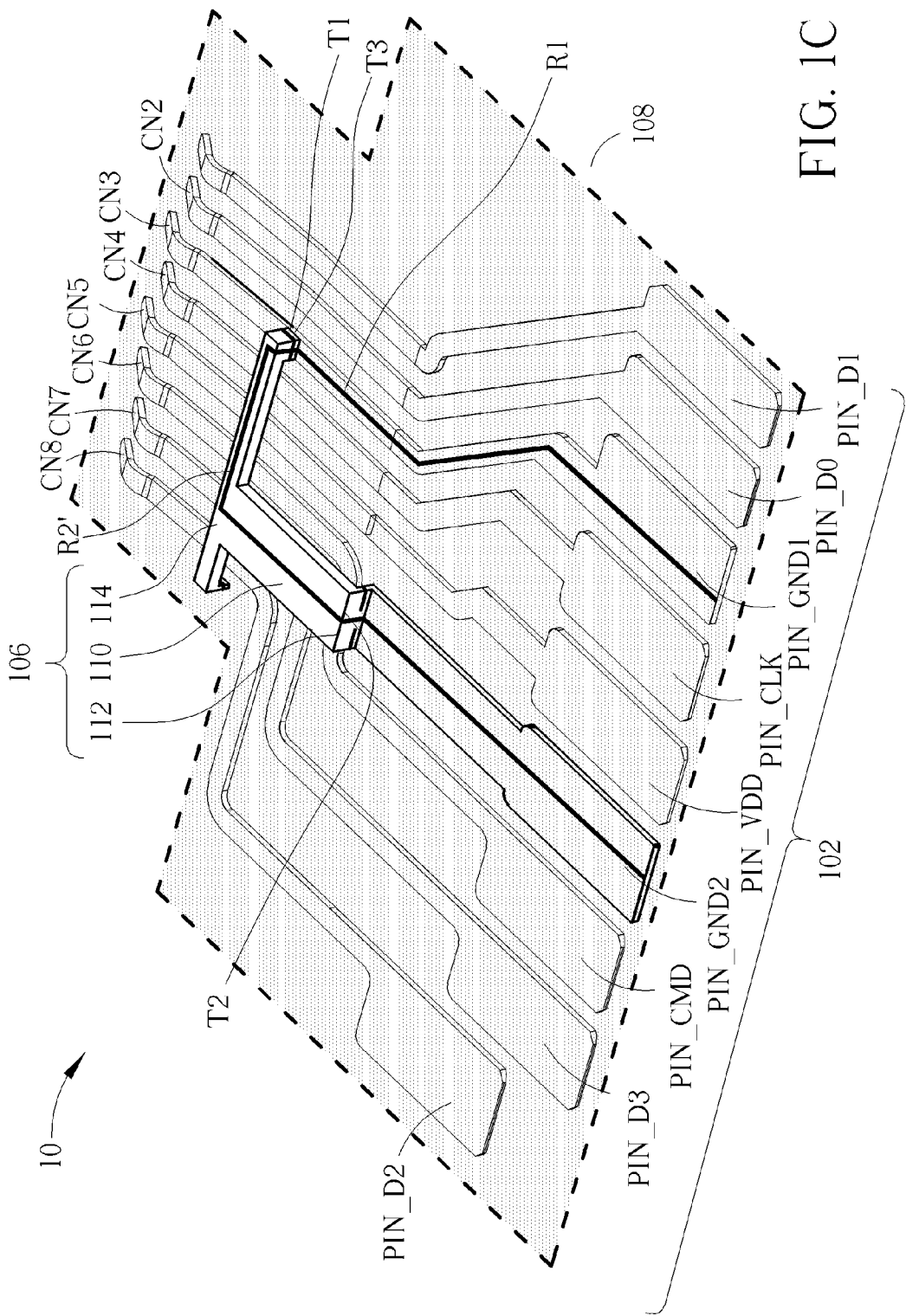
Figure 11:
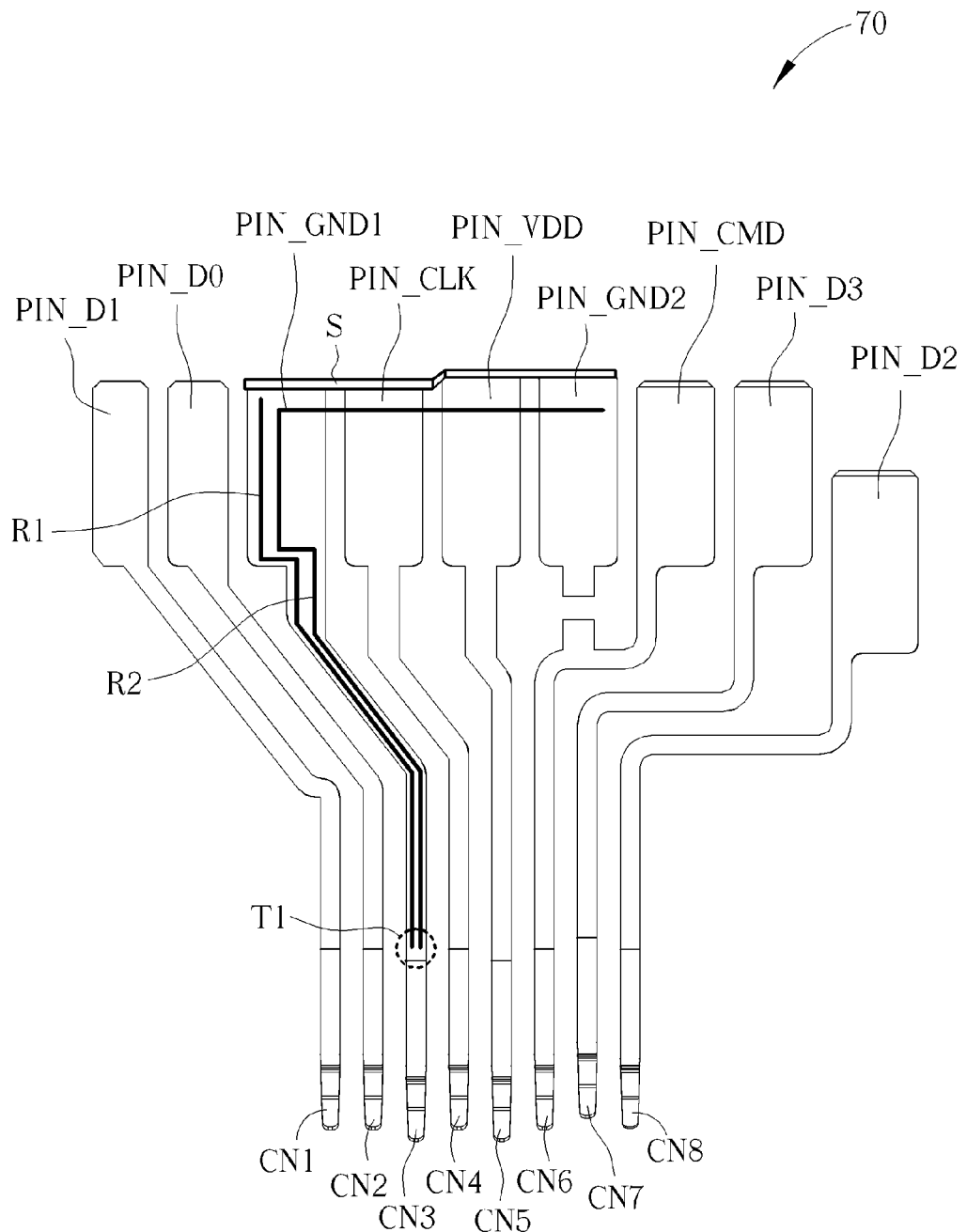
FIG. 11 is a schematic diagram of a micro secure digital adapter according to the prior art.

Please refer to FIGS. 1A-1C, which are schematic diagrams of a micro secure digital (SD) adapter 10 according to an embodiment of the present invention. The micro SD adapter 10 is used for adapting a micro SD card to an SD interface. As shown in FIG. 1A, the micro SD adapter 10 includes a micro SD slot 100, a pin module 102, the connectors CN1-CN8 and a conducting module 106. The micro SD slot 100 is used for disposing and fixing the micro SD card. The pin module 102 conforms to SD specification for connecting to an SD interface of a host device and transmitting signals between the micro SD card and the host device via the connectors CN1-CN8. In other words, the pin module 102 includes the data pins PIN_D0-PIN_D3, the ground pins PIN_GND1-PIN_GND2, the clock pin PIN_CLK, the voltage pin PIN_VDD and the command pin PIN_CMD as shown in FIG. 11. For simplicity, the data pins PIN_D0-PIN_D3, the clock pin PIN_CLK, the voltage pin PIN_VDD and the command pin PIN_CMD are classified as signal pins. The connectors CN1-CN8 conducts the signal pins (i.e. PIN_D0-PIN_D03, PIN_CLK, PIN_VDD and PIN_CMD) and the ground pin PIN_GND1 to the micro SD card when the micro SD card is disposed in the micro SD slot. In other words, the ground pin PIN_GND2 is not connected to the micro SD card. Besides, the conducting module 106 is electrically connected between the terminal T1 of the connector CN3 corresponding to the ground pin PIN_GND1 and the ground pin PIN_GND2; that is to say that the ground pin PIN_GND2 is not connected to the ground pin PIN_GND1 directly.

In detail, as shown in FIGS. 1B-1C, the micro SD adapter 10 includes an isolation layer 108 covering the pin module 102. Moreover, the conducting module 106 includes a metal slice 110, a first via 112 and a second via 114. The metal slice 110 is disposed on the isolation layer 108. The first via 112 is formed in the isolation layer 108 and electrically connected to a terminal T2 of the metal slice 110 with the second ground pin PIN_GND2. The second via 114 is formed in the isolation layer 108 and electrically connected to a terminal T3 of the metal slice 110 with the first ground pin PIN_GND1. Besides, a route R2' from the ground pin PIN_GND2 through the conducting module 106 (i.e. the terminals T2 and T3) to the terminal T1 of the connector CN3 substantially equals the route R1 from the ground pin PIN_GND1 through a part of the connector CN3 to the terminal T1 of the connector CN3. The route R2' can be regarded as a return path for the signals in the data pins PIN_D3 and PIN_D2, such that with the similar distances of the routes R1 and R2', the resistance of the return path for the signals in the data pins PIN_D2 and PIN_D3 are similar to that in the data pins PIN_D0 and PIN_D1. Therefore, the return loss for the signals in the data pins PIN_D3 and PIN_D2 is reduced and the signal quality of the data pins PIN_D3 and PIN_D2 is further improved.

In brief, the conducting module 106 connects to the pin module 102 to shorten the route R2' from the ground pin PIN_GND2 through the conducting module 106 to the terminal T1 of the connector CN3 and makes the route R2' from the ground pin PIN_GND2 through the conducting module 106 to the terminal T1 of the connector CN3 substantially equal the route R1 from the ground pin PIN_GND1 through a part of the connector CN3 to the terminal T1 of the connector CN3, so that the resistance of the return path for the signals in the data pins PIN_D3 and PIN_D2 is decreased, the return loss for the signals in the data pins PIN_D3 and PIN_D2 is reduced accordingly and the signal quality of the data pins PIN_D3 and PIN_D2 is further improved.

Note that, the micro SD adapter 10 is an example of the present invention, and those skilled in the art should readily make combinations, modifications and/or alterations on the abovementioned description and examples. For example, the micro SD adapter 10 is simplified to describe the present invention, but not limited herein. The micro SD adapter 10 can further include a plastic housing to protect the micro SD adapter 10 and a plurality of leaf springs to fix the pin module 102. The micro SD adapter 10 may also include a conducting strip to connect the ground pin PIN_GND1 and the ground pin PIN_GND2, as the conventional secure digital adapter does. In addition, the micro SD adapter 10 can further separate the connectors CN1-CN8 into two parts. The first part is about a plurality of connectors. The second part is about a pin module located at an end of the connectors CN1-CN8 and near the micro SD slot 100, but not symbolized in FIG. 1A-1C.

Figure 2:
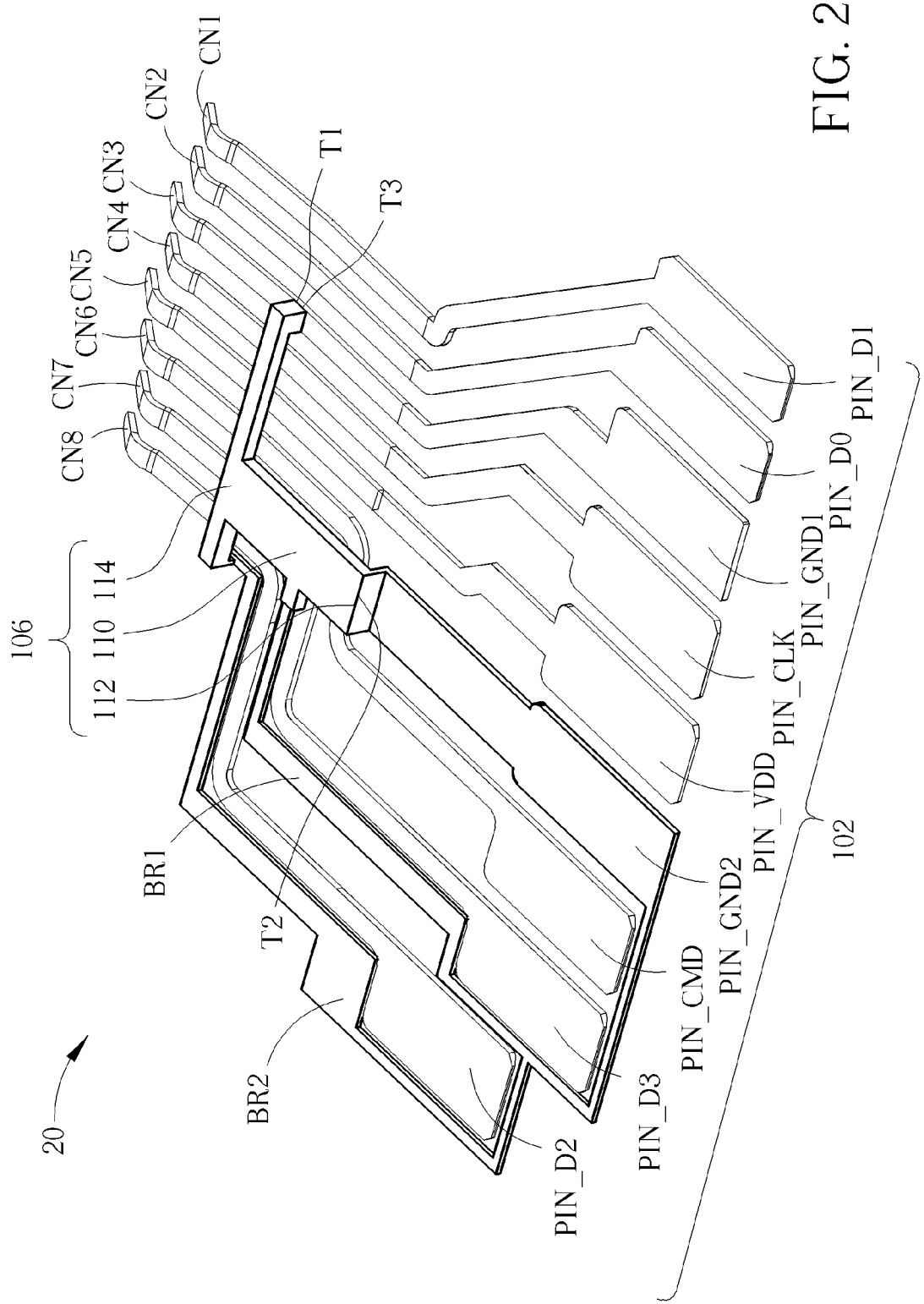
FIGS. 2-6 are schematic diagrams of micro secure digital adapters according to the present invention.

Please continue to refer to FIGS. 2-6, which are schematic diagrams of micro SD adapters 20, 30, 40, 50 and 60 according to the present invention. The micro SD adapters 20, 30, 40, 50 and 60 are similar with the micro SD adapter 10. In detail, as shown in FIG. 2, the difference between the micro SD adapters 10 and 20 is that the conducting module 106 further includes metal branches BR1 and BR2, electrically connected to the metal slice 110 and near the data pins PIN_D3 and PIN_D2, so that the crosstalk between the data pins PIN_D3 and PIN_D2 is reduced. The number of the metal branches is set to two, but not limited herein. In other words, the conducting module 106 can have one or more than one metal branches near at least one pin of the pin modules 102.

Figure 3:
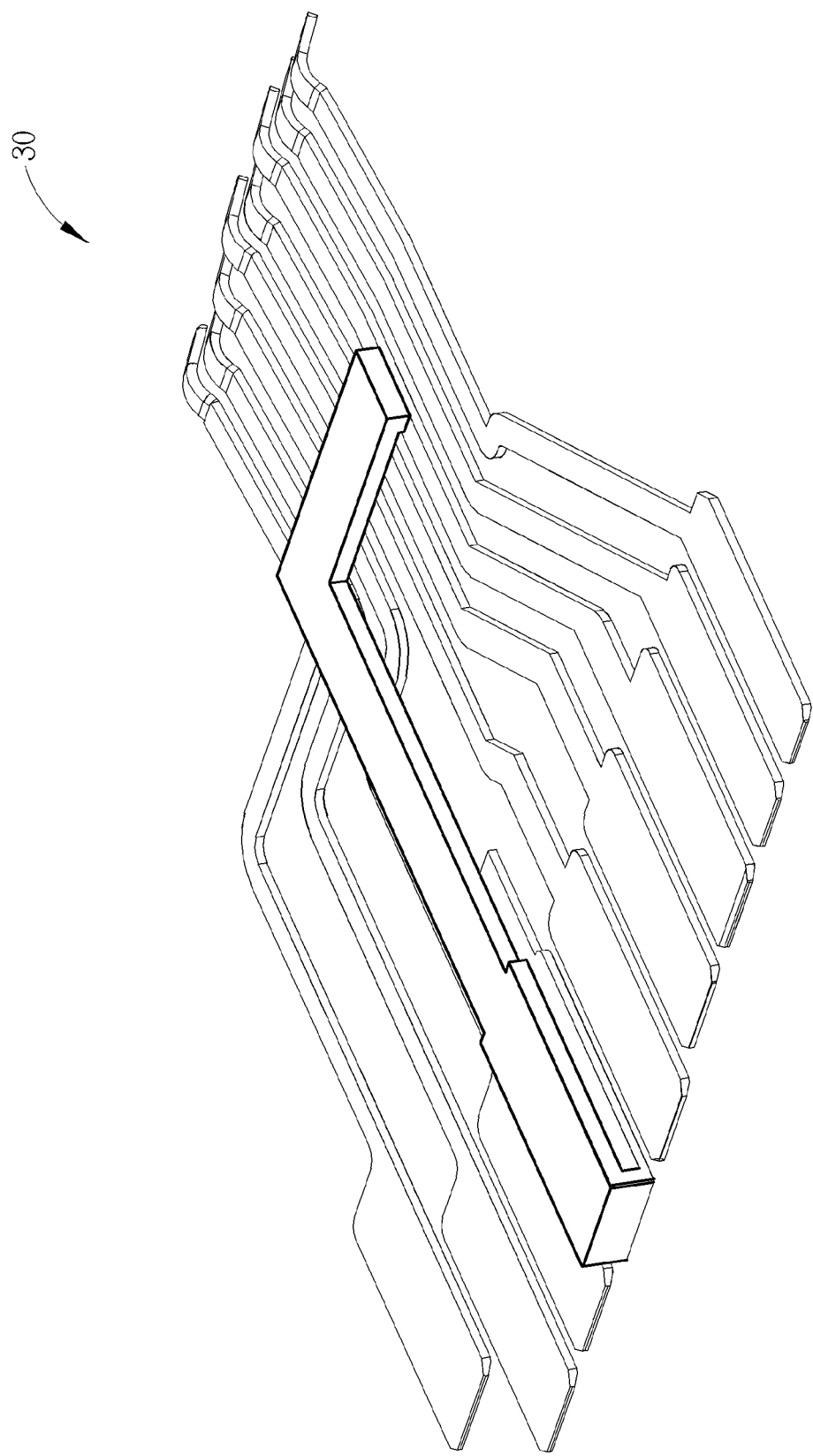

Besides, as shown in FIG. 3, the difference between the micro SD adapters 10 and 30 is that a result of projecting the metal slice 110 on a plane extended by the ground pin PIN_GND2 is overlapped with at least a part of the ground pin PIN_GND2. In other words, the conducting module 106 is expanded to places above the ground pin PIN_GND2, so that the route from the ground pin PIN_GND2 through the conducting module 106 to the terminal T1 of the connector CN3 is much shorten and the signal quality of the data pins PIN_D3 and PIN_D2 is further improved.

Figure 4:
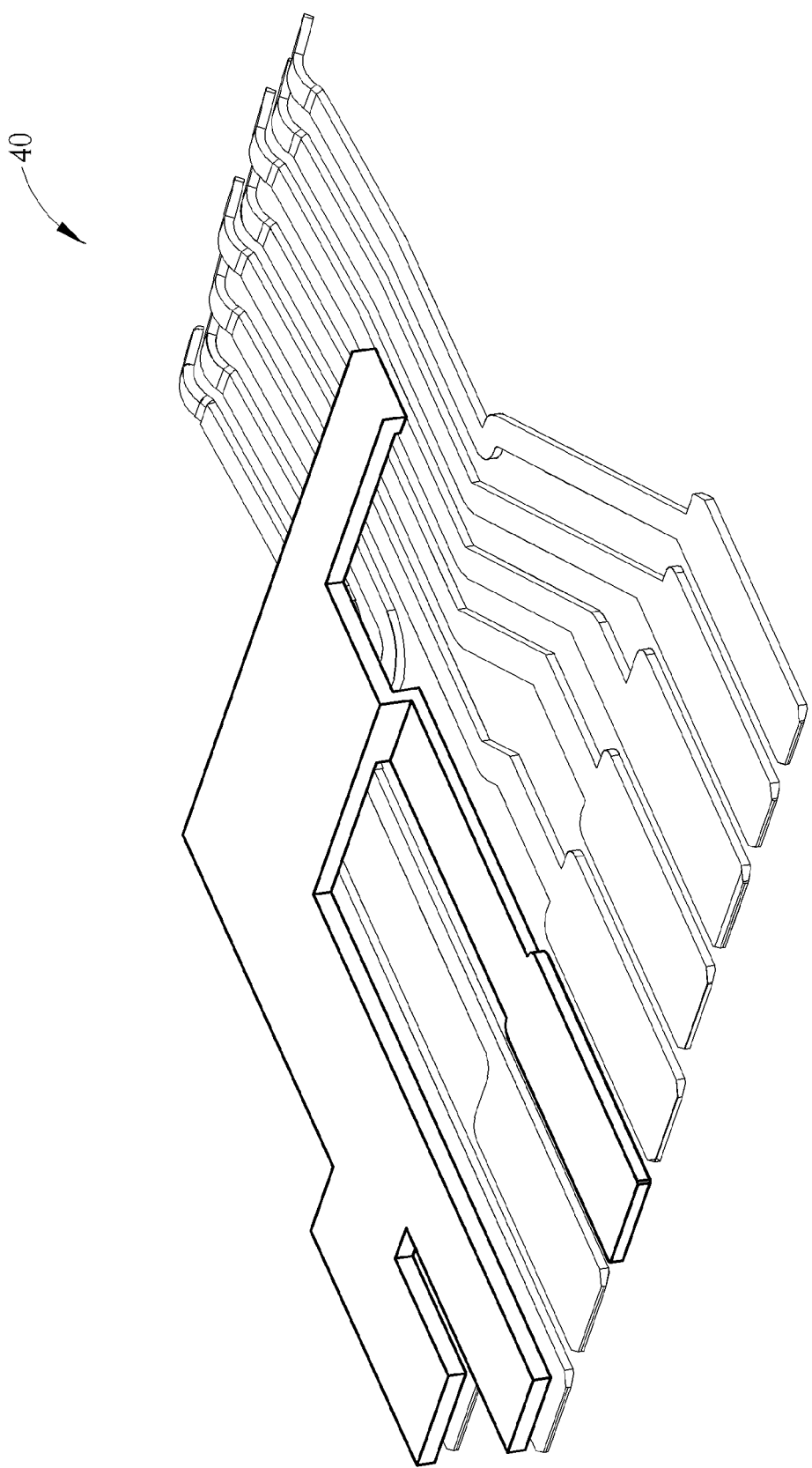

Moreover, as shown in FIG. 4, the difference between the micro SD adapters 10 and 40 is that a result of projecting the metal slice 110 on the plane extended by the ground pin PIN_GND2 is overlapped with a part of the data pins PIN_D3 and PIN_D2. In other words, the conducting module 106 is expanded to places above the data pins PIN_D3 and PIN_D2, so that the resistance of the return path for the signals in the data pins PIN_D3 and PIN_D2 and the crosstalk between the data pins PIN_D3 and PIN_D2 are reduced, to further improve the signal quality of the data pins PIN_D3 and PIN_D2.

Figure 5:
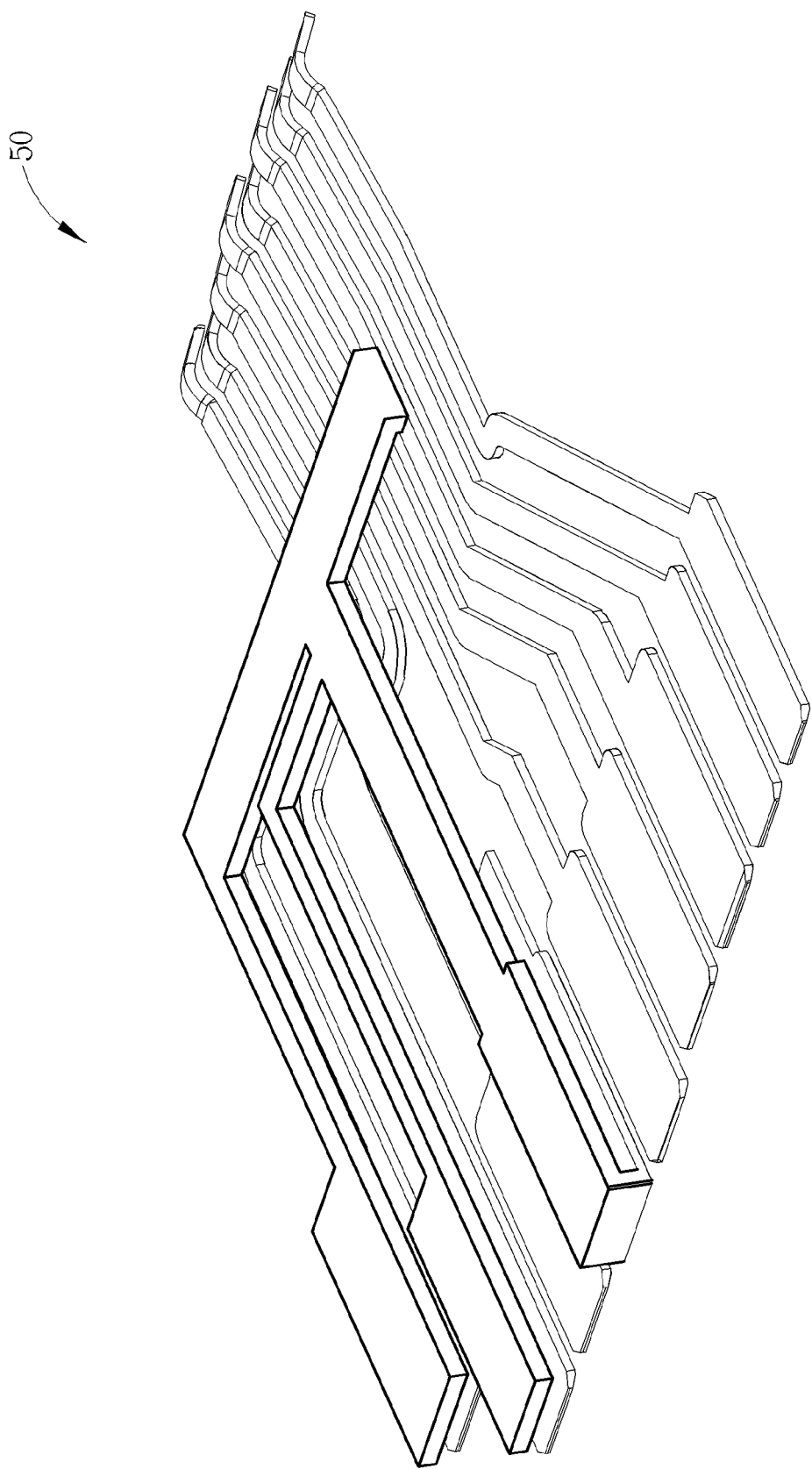

In addition, the micro SD adapter 50 is a combination of the micro SD adapters 30 and 40, as shown in FIG. 5. Therefore, the micro SD adapter 50 not only shortens the route from the ground pin PIN_GND2 through the conducting module 106 to the terminal T1 of the connector CN3 but also reduces the crosstalk between the data pins PIN_D3 and PIN_D2, to improve the signal quality of the data pins PIN_D3 and PIN_D2.

Figure 6:
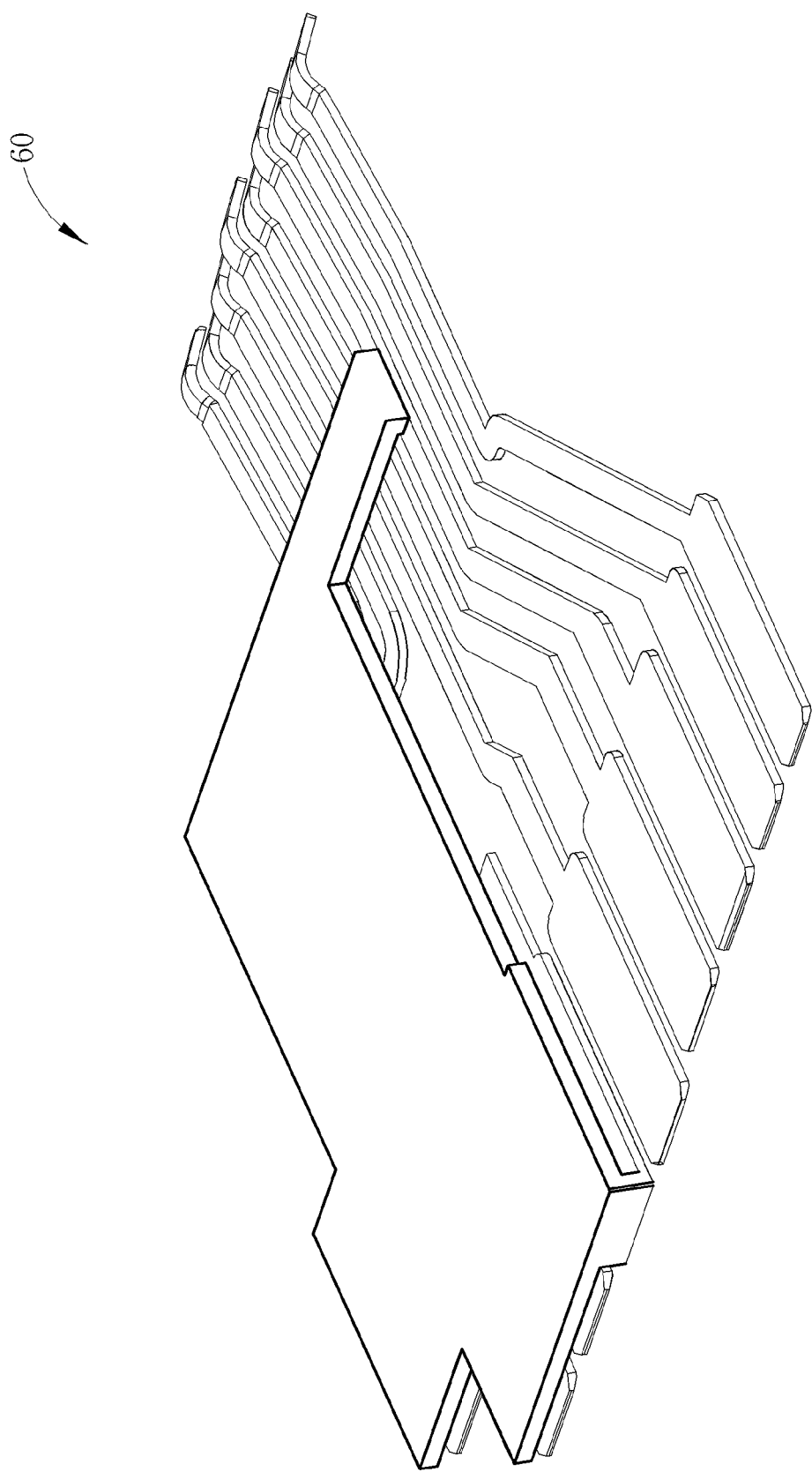

Furthermore, the micro SD adapter 60 is an extension from the micro SD adapter 50. As shown in FIG. 6, the micro SD adapter 60 expands the conducting module 106 to place above the command pin CMD. Note that, the projection area overlapped with the pin module 102 is dependent on a design of a micro SD adapter, but not limited herein. In other words, the conducting module 106 can be expanded to places above different pins of the pin module 102.

In brief, the micro SD adapters 20, 30, 40, 50 and 60 not only uses the conducting module 106 to connects the ground pins PIN_GND1 and PIN_GND2, but also expands the conducting module 106 to places above a part of the pin module 102. Therefore, the return loss for the signals in the pin modules and the crosstalk between data pins in the pin module 102 are reduced. The signal quality of the pin module 102 is further improved.

Figure 7:
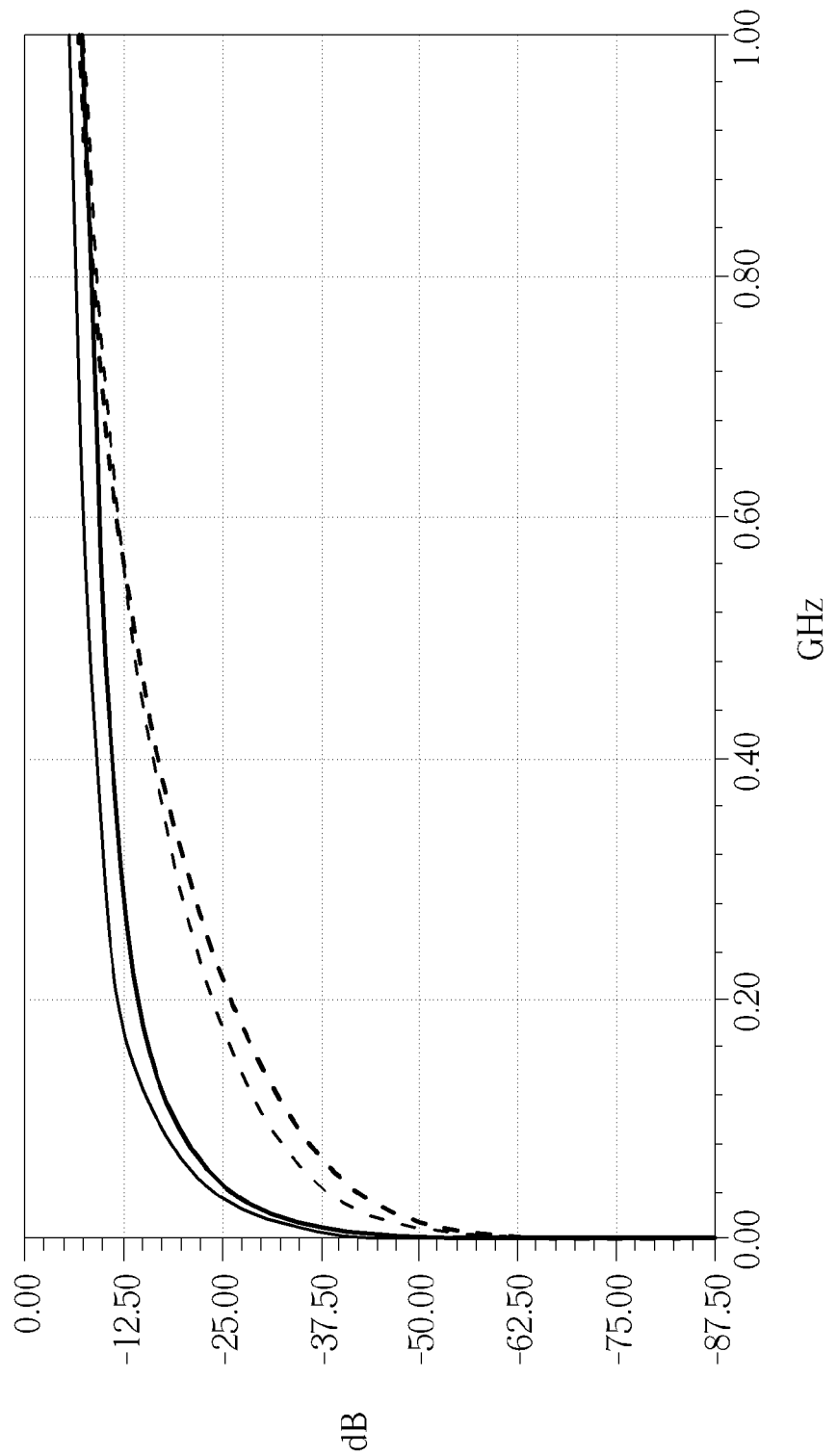
FIG. 7 is a curve diagram of a relationship between the frequency-band and the return loss for the micro secure digital adapter in FIG. 5.

Please refer to FIG. 7, which is a curve diagram of a relationship between the frequency band and the return loss for the micro SD adapter 50. In FIG. 7, the upper and lower dotted lines respectively represent the return loss for signals in the data pins PIN_D3 and PIN_D2 in the micro SD adapter 50. The upper and lower solid lines respectively represent the return loss of signals in corresponding data pins in a conventional micro SD adapter such as the micro SD adapter 70. As shown in FIG. 7, the return loss of the signals in the data pins PIN_D3 and PIN_D2 in the micro SD adapter 50 is better than that in the conventional micro SD adapter. Therefore, the micro SD adapter 50 of the present invention is capable of reducing the return loss for high-frequency signals, so as to efficiently handle the high speed signals.

Figure 8:
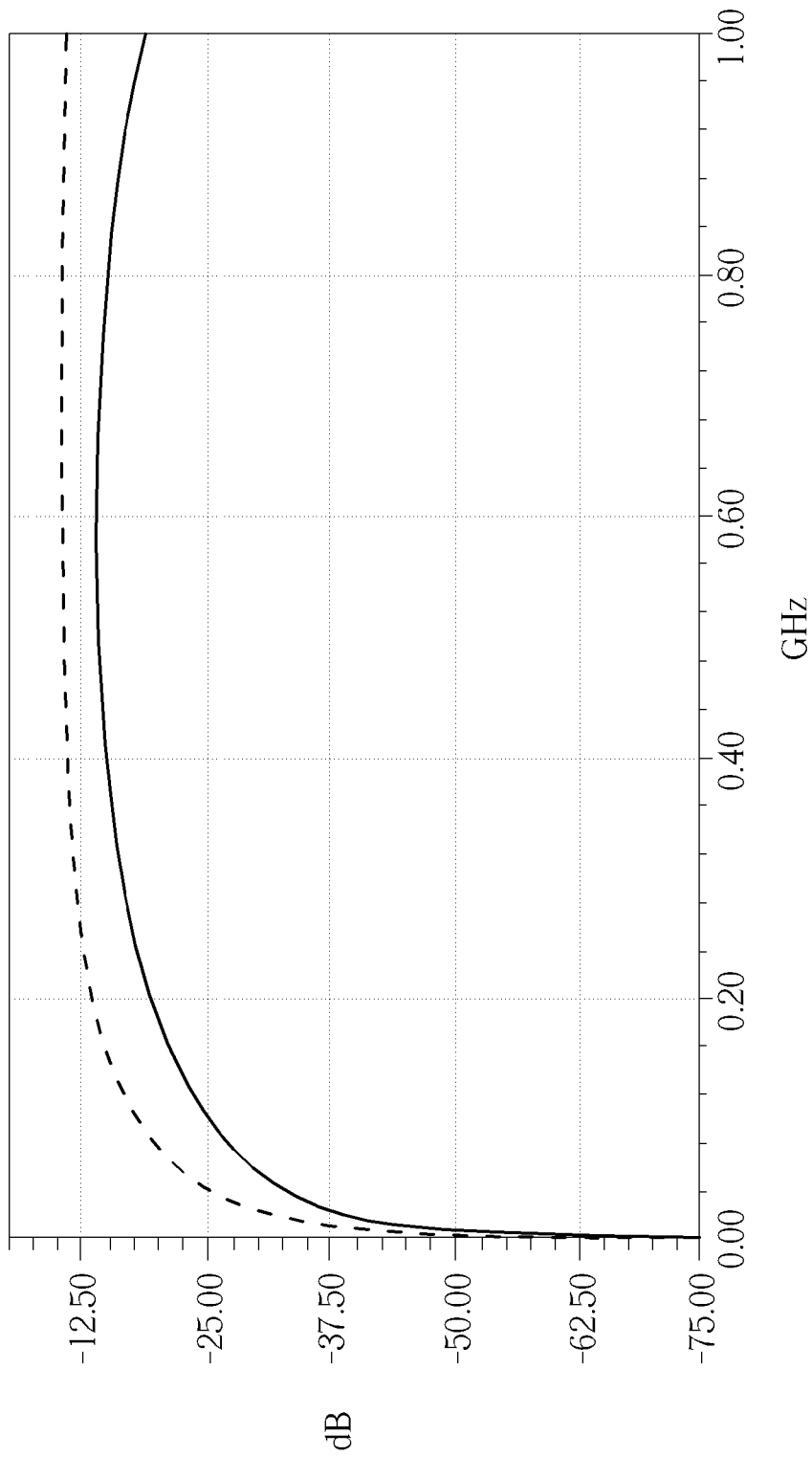
FIG. 8 is a curve diagram of a relationship between the frequency-band and the crosstalk for the micro secure digital adapter in FIG. 5.

Please refer to FIG. 8, which is a curve diagram of a relationship between the frequency-band and the crosstalk for the micro SD adapter 50. In FIG. 8, the solid line represents the crosstalk between the data pins PIN_D3 and PIN_D2 in the micro SD adapter 50. The dotted line represents the crosstalk between the corresponding data pins in a conventional micro SD adapter such as the micro SD adapter 70. As shown in FIG. 8, the crosstalk between the data pins PIN_D3 and PIN_D2 in the micro SD adapter 50 is better than that in the conventional micro SD adapter. Therefore, the micro SD adapter 50 in the present invention is capable of reducing the crosstalk for high-frequency signals, so as to handle the high speed signals with low crosstalk.

Figure 9:
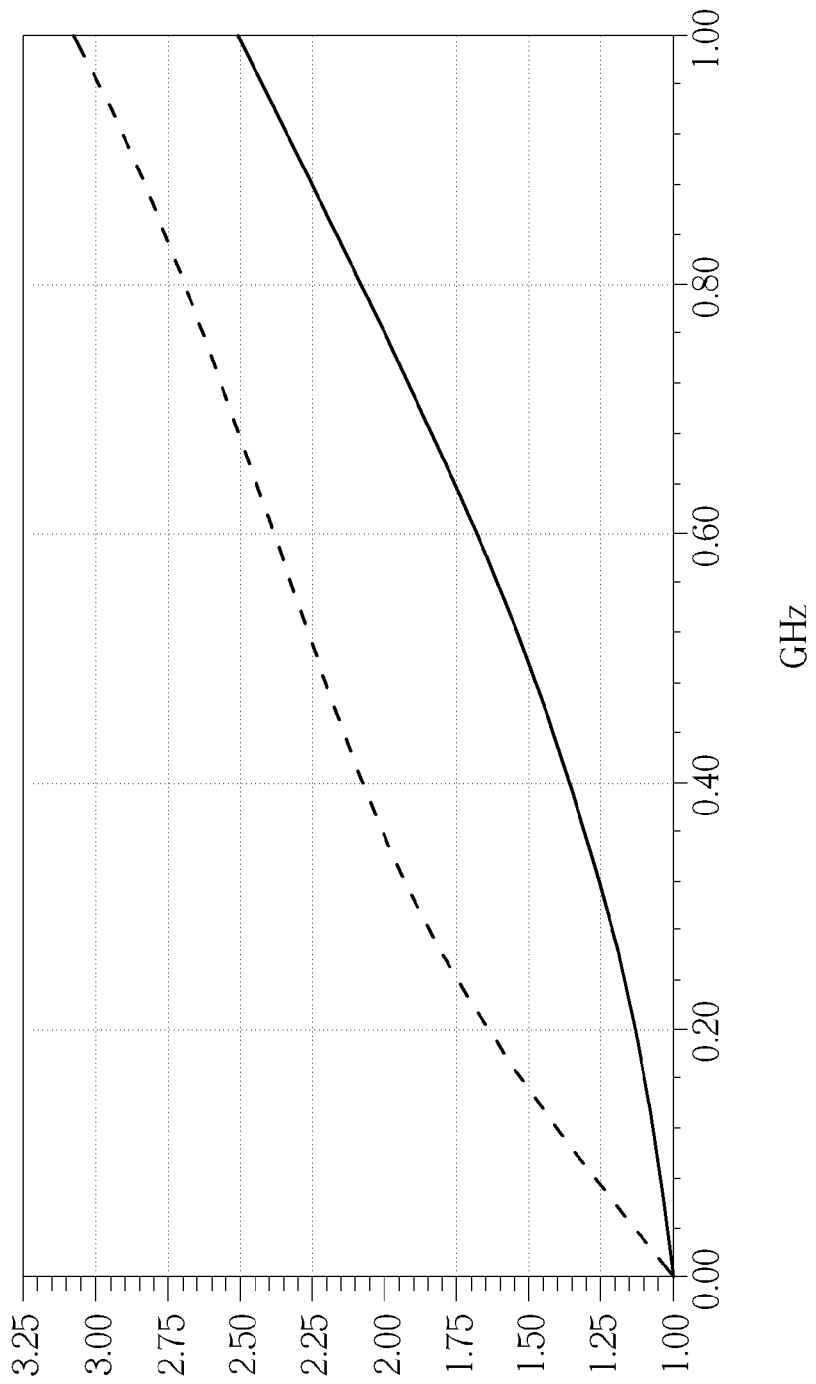
FIGS. 9-10 are curve diagrams of a relationship between the frequency-band and the voltage standing wave ratio for data pins of the micro secure digital adapter in FIG. 5.
Figure 10:
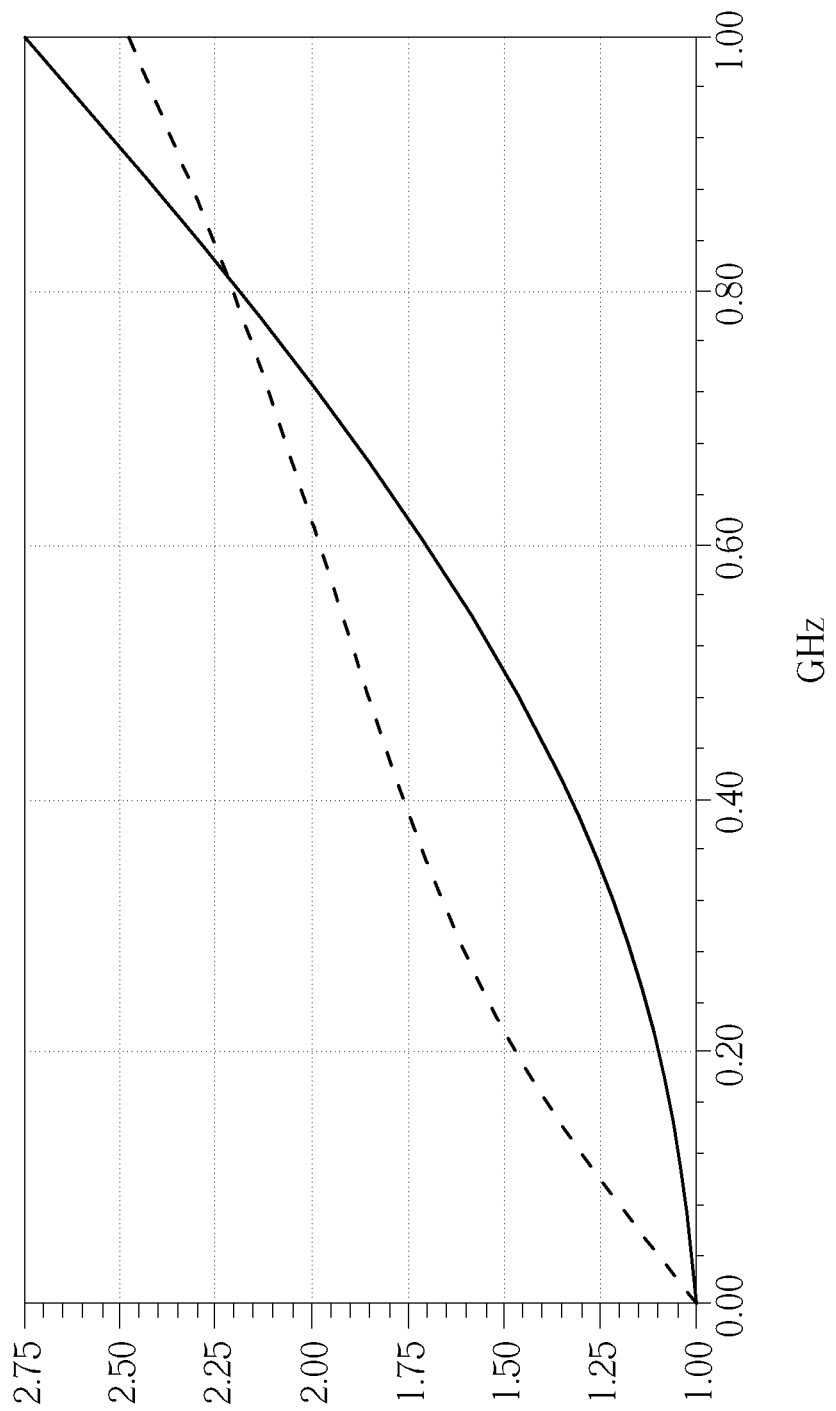

Please refer to FIGS. 9-10, which are curve diagrams of a relationship between the frequency-band and the voltage standing wave ratio (VSWR) for the data pins of the micro SD adapter 50. In FIG. 9, the solid line represents the VSWR for the data pin PIN_D2 in the micro SD adapter 50. The dotted line represents the VSWR for the corresponding data pin in the conventional micro SD adapter such as the micro SD adapter 70. As shown in FIG. 9, the VSWR for the data pin PIN_D2 in the micro SD adapter 50 is lower than that in the conventional micro SD adapter. Besides, In FIG. 10, the solid line represents the VSWR for the data pin PIN_D3 in the micro SD adapter 50. The dotted line represents the VSWR for the corresponding data pin in the conventional micro SD adapter. As shown in FIG. 10, the VSWR for the data pin PIN_D3 in the micro SD adapter 50 is lower than that in the conventional micro SD adapter. Therefore, the micro SD adapter 50 in the present invention is capable of lowering the VSWR for high-frequency signals, to efficiently handle the high speed signals.

In the present invention, the micro SD adapters provide the conducting module connecting to the pin module to reduce the resistance of the return path for the signals in the data pins. Besides, the conducting module further expands to places above a part of the pin module, so that the crosstalk between the data pins of the pin module is reduced and the signal quality of the data pins is improved.

To sum up, the present invention provides micro SD adapters for reducing the return loss and the crosstalk, to improve the signal quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro secure digital (SD) adapter, for adapting a micro SD card to an SD interface, the micro SD adapter comprising:
   a micro SD slot, for disposing the micro SD card;
   a pin module, comprising a plurality of signal pins, a first ground pin, and a second ground pin;
   a plurality of connectors, for conducting the plurality of signal pins and the first ground pin to the micro SD card according to a pin configuration of the micro SD card when the micro SD card is disposed in the micro SD slot; and
   a conducting module, electrically connected between a terminal of a first connector corresponding to the first ground pin and the second ground pin;
   wherein a route from the second ground pin through the conducting module to the terminal of the first connector substantially equals a route from the first ground pin through a part of the first connector to the terminal of the first connector.

2. The micro SD adapter of claim 1, further comprising an isolation layer covering the plurality of signal pins, the first ground pin and the second ground pin.

3. The micro SD adapter of claim 2, wherein the conducting module comprises:
   a metal slice, disposed on the isolation layer;
   a first via, formed in the isolation layer, and electrically connecting a terminal of the metal slice with the second ground pin; and
   a second via, formed in the isolation layer, and electrically connecting another terminal of the metal slice with the terminal of the first ground pin.

4. The micro SD adapter of claim 3, wherein a result of projecting the metal slice on a plane extended by the second ground pin is overlapped with at least a part of the second ground pin.

5. The micro SD adapter of claim 3, wherein a result of projecting the metal slice a plane extended by the second ground pin is overlapped with a part of the plurality of signal pins.

6. The micro SD adapter of claim 3, wherein the conducting module further comprises at least a metal branch, electrically connected to the metal slice and near at least one of the plurality of signal pins.

7. An adapter, comprising:
   a plurality of first conductors, comprising
      a plurality of first pins located at first end of the first conductors, comprising a plurality of first signal pins, a first ground pin, and a second ground pin, for conducting an interface of a first type of memory; and
      a plurality of second pins located at second end of the first conductors, comprising a plurality of second signal pins corresponding to the first signal pins, and a third ground pin corresponding to the first ground pin, for conducting an interface of a second type of memory; and
   a second conductor electrically connected between the second ground pin and the third ground pin without connecting to the first ground pin directly.

8. The adapter of claim 7, further comprising an isolation layer located between the plurality of first conductors and the second conductor.

9. The adapter of claim 7, wherein the first type of memory is a SD card and the second type of memory is a micro SD card.

10. The adapter of claim 7, wherein a result of projecting the second conductor on a plane extended by the second ground pin is overlapped with at least a part of the second ground pin.

11. The adapter of claim 7, wherein the second conductor further comprises at least a metal branch, electrically connected to the second ground pin and near at least one of the plurality of first signal pins.

* * * * *